(12) United States Patent
Hu et al.

(10) Patent No.: US 7,939,425 B2
(45) Date of Patent: May 10, 2011

(54) METHOD OF FABRICATING A DEVICE WITH FLEXIBLE SUBSTRATE AND METHOD FOR STRIPPING FLEXIBLE-SUBSTRATE

(75) Inventors: Tarng-Shiang Hu, Hsinchu (TW); Jing-Yi Yan, Taoyuan (TW); Jia-Chong Ho, Taipei County (TW); Cheng-Chung Lee, Taitung (TW)

(73) Assignee: Industrial Technology Research Institute, Hsinchu (TW)

( * ) Notice: Subject to any disclaimer, the term of this patent is extended or adjusted under 35 U.S.C. 154(b) by 62 days.

(21) Appl. No.: 12/497,297

(22) Filed: Jul. 2, 2009

(65) Prior Publication Data

US 2009/0271981 A1    Nov. 5, 2009

Related U.S. Application Data

(62) Division of application No. 11/256,399, filed on Oct. 19, 2005, now Pat. No. 7,575,983.

(30) Foreign Application Priority Data

Sep. 13, 2005 (TW) .............................. 94131431 A

(51) Int. Cl.
*H01L 21/30* (2006.01)
*H01L 21/46* (2006.01)

(52) U.S. Cl. ................................ 438/458; 257/E21.567

(58) Field of Classification Search ........... 257/E21.567; 438/458

See application file for complete search history.

(56) References Cited

U.S. PATENT DOCUMENTS

| 7,223,672 B2 * | 5/2007 | Kazlas et al. | 438/458 |
| 2006/0128083 A1 * | 6/2006 | Park et al. | 438/197 |

* cited by examiner

*Primary Examiner* — Asok K Sarkar
(74) *Attorney, Agent, or Firm* — J.C. Patents

(57) ABSTRACT

A method for fabricating a device with a flexible substrate includes providing a rigid substrate at first. Next, an interfacing layer can be formed on the rigid substrate, and then a flexible substrate is directly formed on the interfacing layer. The flexible substrate fully contacts the interfacing layer. A device structure is then formed on the flexible substrate.

7 Claims, 4 Drawing Sheets

METHOD OF FABRICATING A DEVICE WITH FLEXIBLE SUBSTRATE AND METHOD FOR STRIPPING FLEXIBLE-SUBSTRATE

CROSS-REFERENCE TO RELATED APPLICATION

This application is a divisional application and claims the priority benefit of U.S. application Ser. No. 11/256,399, filed on Oct. 19, 2005, now allowed, which claims the priority benefit of Taiwan application serial no. 94131431, filed on Sep. 13, 2005. The entirety of each of the above-mentioned patent applications is hereby incorporated by reference herein and made a part of this specification.

BACKGROUND OF THE INVENTION

1. Field of Invention

The present invention relates to a method for fabricating a device with a flexible substrate. More particularly, the present invention relates to a method for fabricating a device with a flexible substrate which can be easily stripped from the rigid substrate.

2. Description of Related Art

As well known, an electronic product includes a lot of electronic devices, such as transistor device. These electronic devices are usually formed on a substrate. Taking the conventional technology in semiconductor fabrication as the example, usually, a silicon substrate is used as a substrate for fabricating the electronic devices. Particularly, almost all of the transistor fabrications take the silicon substrate as the substrate in fabrication. However, the silicon substrate is a rigid substrate, and therefore the device being formed is also a rigid device, without being flexible. The electronic product is then not bent.

As the technology is continuously developed, some electronic devices can be formed from organic material. For example, the technology about the organic thin film transistor (OTFT) has gradually been well developed. For the available organic materials, the materials are generally divided into two types, for example, material with small molecules, such as pentacene, or material with large molecules, such as polymer.

In comparing the OTFT with the conventional in-organic transistor, the OTFT can be fabricated under a relative low temperature, therefore the substrate can be selected from plastic or glass, which are light, thin, and cheap. In addition, the fabrication process for the OTFT is simpler, and can use the printing technology to directly pattern the organic thin film. This can decrease the number of masks being used and the vacuum deposition equipments. Further, since the OTFT is suitable for fabrication with the plastic substrate and is compatible with the process of roll-to-roll, it is quite helpful to reduce the fabrication cost in the future.

In order to form device on the flexible substrate, it should be overcome on the issues that the temperature and stress may cause deformation on the substrate and then occurrence of misalignment. Some conventional issues are described as follows.

FIGS. 1A-1C are cross-sectional views, schematically illustrating the conventional fabrication process for the OTFT. In FIG. 1A, a rigid substrate 100 is provided to serve as the fabrication substrate. In addition, a flexible substrate 104 is adhered to the rigid substrate 100 by an adhesive layer 102. The flexible substrate 104 is used for fabricating devices thereon.

Then, in FIG. 1B, a device structure, such as an OTFT, is to be formed on the flexible substrate 104. The fabrication process includes, for example, a gate electrode 108 is formed on the flexible substrate 104. A dielectric layer 106 is formed over the flexible substrate 104 and covers the gate electrode 108.

It should be noted that since the fabrication processes are performed under a temperature. For example, all of the material layers, including the adhesive layer 102, may cause a bending, such as bending up as shown in FIG. 1B, due to difference of the thermal expansion coefficient. As a result, the requirement of alignment in fabrication device may have the misalignment for the position of the gate electrode 108.

Further in FIG. 1C, when the flexible substrate 104 is stripped from the rigid substrate 100, due to the adhering force from the adhesive layer 102, the flexible substrate 104 is not easy to be stripped, and it needs to apply a stress on it, so as to be stripped. In addition, since the adhesive layer 102 in the fabrication process is still under the temperature of about 200° C., and the adhesive material could be transformed and cured into different material, and then a residue 102a may remain on the back of the flexible substrate 104. This would cause the poor quality of the device, or even damage the device. Moreover, the adhesive material is necessary to be coated and then adhered to the rigid substrate, the planarity of the substrate cannot be easily controlled, and the fabrication processes are complicate. The poor planarity of the substrate may also cause the issue of misalignment.

For another conventional technology is shown in FIGS. 2A-2C. Referring FIG. 2A, in order to reduce the amount of use for the adhesive material, the adhering tapes 116 are only on the four corners, for adhering the flexible substrate 104. As a result, a space gap 118 exists between the flexible substrate 104 and the rigid substrate 104. FIG. 2B is a top view in FIG. 2A. The adhering tapes 116 are on the four corners of the flexible substrate 104.

In FIG. 2C, the subsequent fabricating processes for the OTFT include, for example, forming the gate electrode 122, the dielectric layer 104, source/drain regions 124 and 126, and the channel layer 128. This conventional method can simplify the process of stripping the flexible substrate 104. However, since the issues about the thermal expansion coefficients for the flexible substrate and the rigid substrate being different severely exits, it cause the misalignment problems on the device being fabricated.

In above considerations, the conventional technology still does not propose the proper flexible substrate 104 for fabricating the device thereon.

SUMMARY OF THE INVENTION

The application provides a method for fabricating a device with flexible substrate, at least allowing the flexible substrate to be formed on the rigid substrate with planarity. In addition, the bending deformation for the flexible substrate under the thermal environment of the processes can be effectively reduced, so as to improve the alignment for the device. Further still, when the device is accomplished in fabrication, the device can be sassily stripped from the rigid substrate with reduction of the residual material.

The application provides a method for fabricating a device with a flexible substrate. The method includes providing a rigid substrate. Next, an interfacing layer can be formed on the rigid substrate, and then a flexible substrate is directly formed on the interfacing layer. The flexible substrate fully contacts the interfacing layer. A device structure is then formed on the flexible substrate.

In accordance with an embodiment, the method further comprises directly stripping the flexible substrate from the interfacing layer, wherein the interfacing layer has a composition recipe, allowing the interfacing layer to be stripped away substantially without the stress.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention provides a method for fabricating a device with flexible substrate, and can have the flexible substrate being planarly formed on the rigid substrate, so that the bending phenomenon on the flexible substrate under the thermal environment in processes can be effectively reduced, and the precise position of the device can be improved. In addition, when the device is accomplished in fabrication, the device can be easily stripped from the rigid substrate with reduction of the residual material. Some embodiments are provided as the examples for descriptions but the present invention is not limited to the embodiments.

Figure 3A:
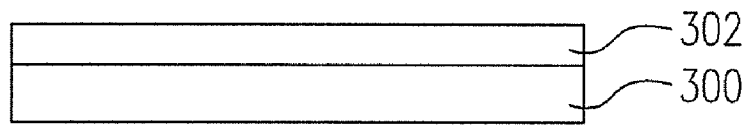
FIGS. 3A-3C are cross-sectional views, schematically illustrating the fabrication processes for the OTFT, according to an embodiment of the present invention.
Figure 3B:
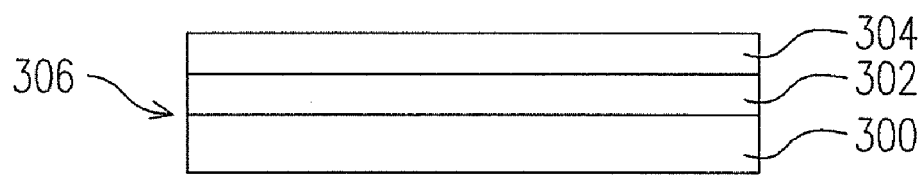
Figure 3C:
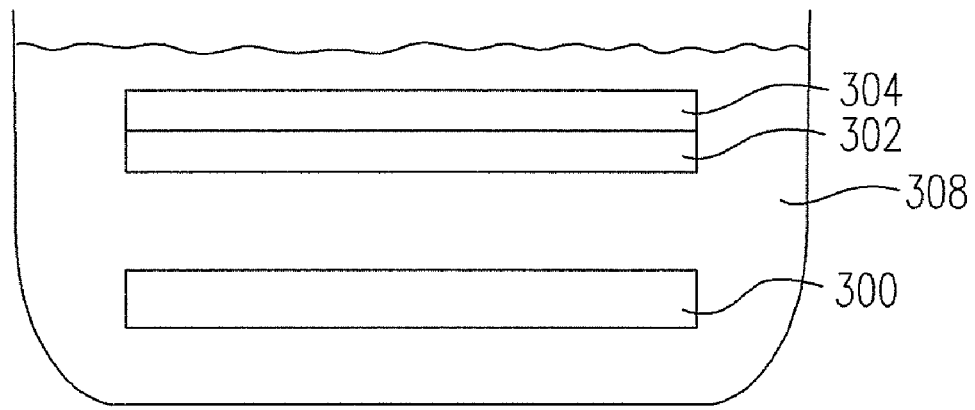

FIGS. 3A-3C are cross-sectional views, schematically illustrating the fabrication processes for the OTFT, according to an embodiment of the present invention. In FIG. 3A, a rigid substrate 300 is provided to serve as a holding base. Material for the rigid substrate 300 can be, for example, glass, quartz, or silicon wafer. Then, a flexible substrate 302 is directly formed on the rigid substrate 300. The flexible substrate 302 serves as a substrate, on which a subsequent device structure can be formed. The flexible substrate 302 can be, for example, a substrate with large molecules or a substrate with small molecules, a mixed substrate from inorganic and organic materials, or even a glass substrate with a thickness of about less than 0.2 mm. In addition, the flexible substrate 302 can be formed by coating process, such as die coating or table coating. After the flexible substrate 302 is formed, it can fully contact with the rigid substrate 300 to form a contact interface 306. This contact interface 306 is helpful for the stripping the flexible substrate 302. The features will be described layer.

In FIG. 3B, a device structure layer 304 is formed on the flexible substrate 302. The device structure layer 304 can be the organic device structure or inorganic device structure. The device can include the usual electronic device, or even can include the non-electronic mechanical structure. The present invention is suitable for use in any structure, which uses the flexible substrate as the structure base. In addition, the device structure layer 304 usually further formed with a protection layer at bottom. The protection layer can be, for example, a hard coating layer for resisting water or a gas barrier layer.

Figure 1A:
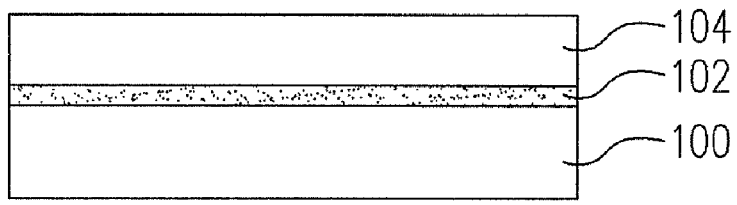
FIGS. 1A-1C are cross-sectional views, schematically illustrating one conventional fabrication process for the OTFT.
Figure 1B:
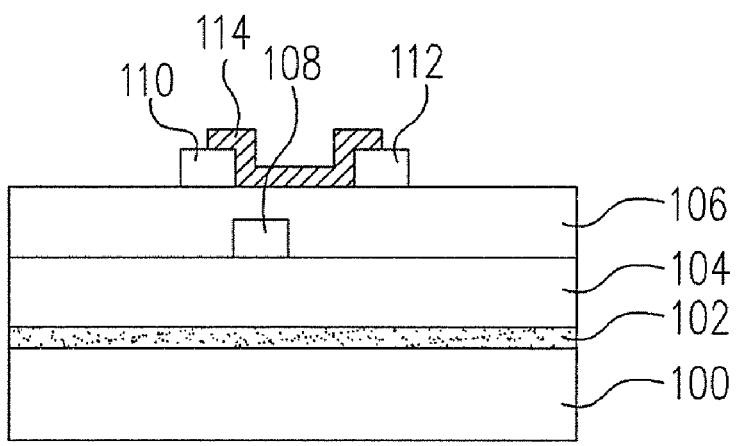
Figure 1C:
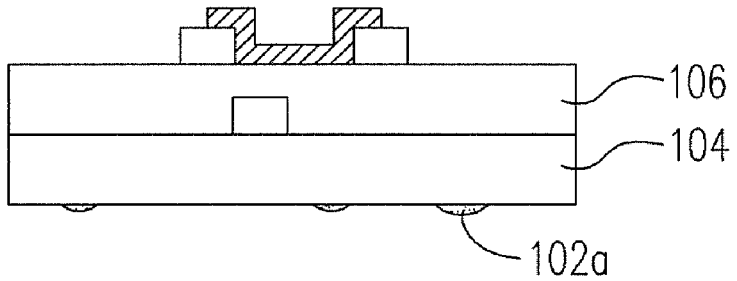
Figure 2A:
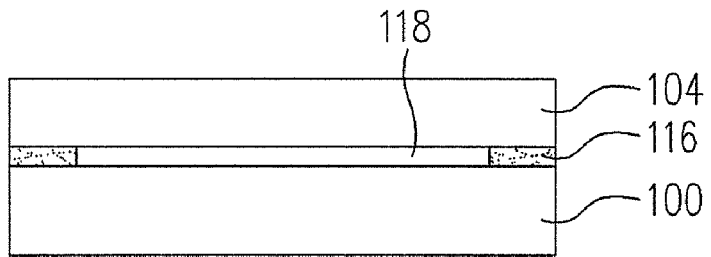
FIGS. 2A-2C are drawings, schematically illustrating another conventional fabrication process for the OTFT.
Figure 2B:
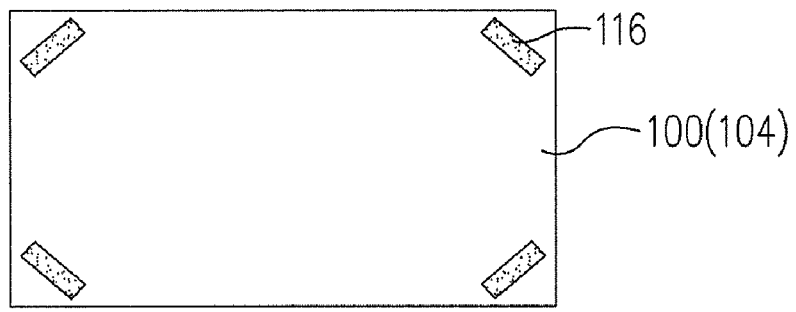
Figure 2C:
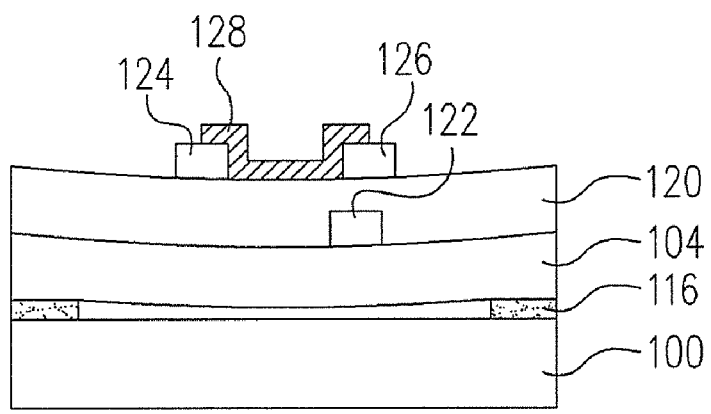

The protection layer is, for example, disposed between the actual device and the flexible substrate 302. Further, for example, the device structure layer 304 can include inorganic semiconductor device structure, organic semiconductor device structure, organic circuit structure, or inorganic circuit structure. The organic semiconductor device structure can be, for example, the OTFT, which can be formed under the process like FIG. 1C. The dielectric layer 106 may have the dielectric constant about greater than 3, and can be organic material or inorganic material. The source/drain regions 110, 112 and the channel layer 114 can be formed on the dielectric layer 106. The material for the source/drain regions 110, 112 and the channel layer 114 can be, for example, metal, conductive polymer material, or conductive material mixed from organic and inorganic materials.

In other words, the present invention is not limited to what the device structure is formed on the substrate 302. However, any proper structure, which needs the flexible substrate 302 to serve as the structure base, can be use the present invention. Therefore, the detail for the device structure 304 is not further described, and can be understood by the ordinary skilled artisans. The features of the present invention are continuously described.

The flexible substrate 302 of the present invention is directly formed on the rigid substrate 300, and therefore has improved planarity, which is useful for device alignment. In addition, in order to easily strip the flexible substrate 302 in subsequence process, the material of the flexible substrate is properly selected. In the preferred embodiment of the present invention, the polymer such as polyimide (PI) poly(dimethylsiloxane) (PMDS), PES, PEN, PET, PC, and these derivatives are used. The polyimide can be directly formed on the rigid substrate 300 by a coated process. The polyimide can form a contact interface 306 with the rigid substrate 300 in substantially non-adhesive contact.

In FIG. 3C, when the device structure layer 304 is accomplished, the device with the flexible substrate 302 is necessary to be stripped from the rigid substrate 300. Due to existence of the contact interface 306, the present invention can perform the stripping process under a substantial non-stress state. For example, the rigid substrate 300 is dipped into a liquid 308. By using the chemical phenomenon, such as hydrophobic property to water, the device on the flexible substrate 302 can be stripped from the rigid substrate 300. Taking the polyimide as the example, the liquid can be, for example, the water. In order to enhance the stripping effect, the liquid 308 can be heated to a temperature. Thus, after dipping for a few minutes, the flexible substrate 302 can be stripped substantially without stress. Further, the flexible substrate 302 does not have the residual material.

Figure 4A:
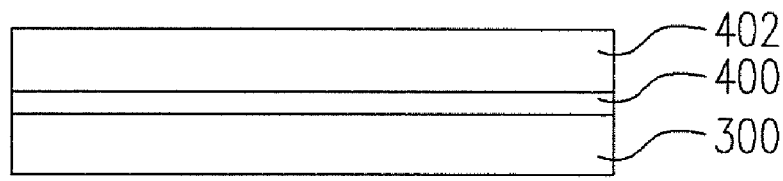
FIGS. 4A-4C are cross-sectional views, schematically illustrating the fabrication processes for the OTFT, according to another embodiment of the present invention.
Figure 4B:
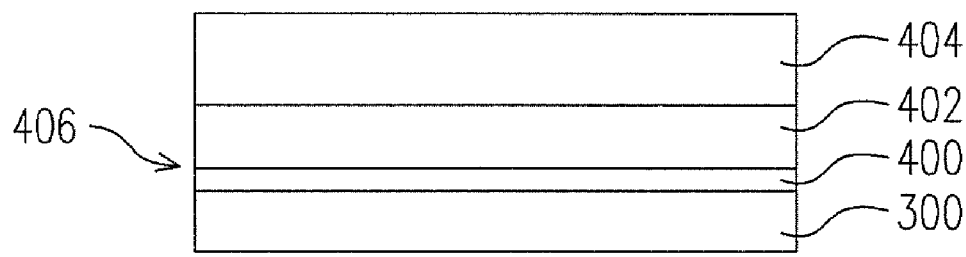
Figure 4C:
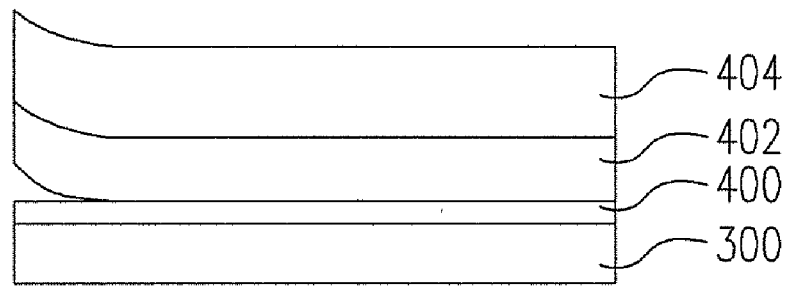

In addition, with the same principle as described above, some modification can be made, as shown in FIGS. 4A-4C. In FIG. 4A, an interfacing layer 400 can be first formed on the rigid substrate 300. The thickness of the interfacing layer 400 is not limited, and preferably is smaller than the rigid substrate. Then, the flexible substrate 402 can be on the interfacing layer 400 by the same method as previously described. In the embodiment, the interfacing layer 400 is, for example, a thin polyimide (PI), and the material for the flexible substrate 402, in accordance with the PI material, preferably is poly(dimethylsiloxane (PMDS), for example. Due to the proper selection on the material, a contact interface 406 can be formed, as shown in FIG. 4B.

In FIG. 4B, the device structure layer 404 is formed on the flexible substrate 402, and is similar to the device structure layer 304 in FIG. 3B, and can be the device structure to be formed on the flexible substrate 402. The descriptions about this part are omitted. However, the remarkable thing is the contact interface 406 produced by the flexible substrate 402 and the interfacing layer 400. After verification, if material for the flexible substrate 402 is PMDS, and composition of the PMDS has a recipe, then the adhering capability at the contact interface can be controlled to a proper level without affecting the formation of the subsequent device. Also and, the adhering capability does cause the flexible substrate 402 to be strongly adhered to the interfacing layer 400. Remarkably, the foregoing selection on material is just an example, and the present invention is not limited to the specific material. The material with the foregoing interfacing function can be used in the present invention to serve as the flexible substrate for fabricating device thereon.

In FIG. 4C, due to the foregoing properties of the present invention, after the device structure layer 404 is formed on the flexible substrate 402, it can be directly stripped without introducing much stress, causing damage or residue on the device. Therefore, in the embodiment, according to the material selection for the interfacing layer 400 and the flexible substrate 402, the flexible substrate 402 is allowed to be stripped substantially without stress. In comparing this embodiment with the embodiment in FIG. 3C, even through the stripping mechanism is little different, both are under the same design aspect. Some advantages can be at least achieved as follows.

In the present invention, the flexible substrate can be directly formed on the rigid substrate. Thus, the planarity of the substrate can be improved, and the bending deformation for the flexible substrate, caused by the difference of thermal expansion coefficients for the materials, can be effectively reduced. The conventional misalignment occurring at the device structure can also be reduced.

In addition, since the present invention has the proper contact interface between the flexible substrate and the rigid substrate, according to the property of the contact interface, the flexible substrate can be stripped in a liquid or can be directly stripped, without causing over stress. As a result, the device is prevented from damage due to over bending and the residue can also be effectively reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a device with a flexible substrate, the method comprising:
    providing a rigid substrate;
    forming an interfacing layer on the rigid substrate;
    directly forming the flexible substrate on the interfacing layer, wherein the flexible substrate fully contacts the interfacing layer;
    forming a device structure on the flexible substrate; and
    stripping the flexible substrate with the device structure from the rigid substrate, wherein the interfacing layer remains on the rigid substrate.

2. The method of claim 1, wherein the step of stripping the flexible substrate from the rigid substrate comprises:
    directly stripping the flexible substrate from the interfacing layer, wherein a material of the flexible substrate is polymer, allowing stripping the flexible substrate from the interface layer.

3. The method of claim 2, wherein a material of the flexible substrate is poly(dimethylsiloxane) (PMDS), PI, PES, PEN, PET, PC, and these derivatives.

4. The method of claim 3, wherein the device structure comprises an organic semiconductor device structure or an inorganic semiconductor device structure.

5. The method of claim 3, wherein the device structure comprises an organic thin film transistor.

6. The method of claim 3, wherein the flexible substrate is formed on the rigid substrate by performing a coating process.

7. The method of claim 3, wherein the step of forming the device structure further comprises forming a protection layer between the device structure and the flexible substrate.

* * * * *